(12) United States Patent
Tan et al.

(10) Patent No.: US 12,422,310 B2
(45) Date of Patent: Sep. 23, 2025

(54) MANUFACTURING METHOD FOR A SURFACE ACOUSTIC WAVE TEMPERATURE SENSOR

(71) Applicant: North University of China, Taiyuan (CN)

(72) Inventors: Qiulin Tan, Taiyuan (CN); Xiaorui Liang, Taiyuan (CN); Xiangrong Li, Taiyuan (CN); Lei Zhang, Taiyuan (CN); Wendong Zhang, Taiyuan (CN); Jijun Xiong, Taiyuan (CN)

(73) Assignee: North University of China, Taiyuan (CN)

(*) Notice: Subject to any disclaimer, the term of this patent is extended or adjusted under 35 U.S.C. 154(b) by 646 days.

(21) Appl. No.: 17/842,285

(22) Filed: Jun. 16, 2022

(65) Prior Publication Data
US 2023/0126060 A1 Apr. 27, 2023

(30) Foreign Application Priority Data
Oct. 25, 2021 (CN) .......................... 202111239976.0

(51) Int. Cl.
*H04R 31/00* (2006.01)
*B22F 7/06* (2006.01)
(Continued)

(52) U.S. Cl.
CPC ............ *G01K 11/265* (2013.01); *B22F 7/062* (2013.01); *G03F 7/0005* (2013.01)

(58) Field of Classification Search
CPC ......... G01K 11/265; B22F 7/062; B22F 7/08; G03F 7/0005
See application file for complete search history.

(56) References Cited

U.S. PATENT DOCUMENTS

| 8,240,911 B1* | 8/2012 | Pfeifer ................... G01K 17/00 374/117 |
| 2007/0046479 A1* | 3/2007 | Hines ................. G01N 29/2481 340/584 |

(Continued)

FOREIGN PATENT DOCUMENTS

CN    213516079 U  *  6/2021

*Primary Examiner* — Paul D Kim
(74) *Attorney, Agent, or Firm* — CURATOLO SIDOTI & TRILLIS CO., LPA; Floyd Trillis, III; Salvatore Sidoti (57) ABSTRACT

The present disclosure discloses a surface acoustic wave temperature sensor and a manufacturing method thereof. The surface acoustic wave temperature sensor includes a sensing module and an antenna module electrically connected to each other. The antenna module includes a first high-temperature-resistant substrate and a patterned antenna formed on a surface of the first high-temperature-resistant substrate, a recess is formed in a first surface of the first high-temperature-resistant substrate, and the sensing module is fixed in the recess. The sensing module and the antenna module of the surface acoustic wave temperature sensor provided by the present disclosure form a whole. Therefore, compared with the prior art, the volume is greatly reduced, and wireless passive temperature monitoring in a high-temperature and narrow space can be better implemented. Moreover, the sensing module can be integrated in the antenna module, and such a structure is more convenient for batch processing.

6 Claims, 5 Drawing Sheets

(51) Int. Cl.
*G01K 11/26* (2006.01)
*G03F 7/00* (2006.01)

(56) References Cited

U.S. PATENT DOCUMENTS

2007/0274371 A1\* 11/2007 Penavaire ............. G01L 9/0022
                                                    310/313 R
2016/0012265 A1\* 1/2016 Struble ................ G01K 11/265
                                                    340/10.1

\* cited by examiner

FIG. 7

MANUFACTURING METHOD FOR A SURFACE ACOUSTIC WAVE TEMPERATURE SENSOR

CROSS REFERENCE TO RELATED APPLICATION

This patent application claims the benefit and priority of Chinese Patent Application No. 202111239976.0, filed on Oct. 25, 2021, the disclosure of which is incorporated by reference herein in its entirety as part of the present application.

TECHNICAL FIELD

The present disclosure relates to the technical field of surface acoustic wave devices, and in particular, to a surface acoustic wave temperature sensor and a manufacturing method thereof.

BACKGROUND ART

In recent years, sensor products have more and more functions and smaller and smaller volumes, and need to be tested and applied in severe environments such as high temperature, narrow and airtight environments, for example, aerospace vehicles, turbine engines, etc. The operation of the aerospace vehicles is often accompanied by severe environments such as high temperature, especially in key parts such as surfaces of hypersonic vehicles, aero engines, and gas turbines, where a local temperature even exceeds 800° C. Therefore, in-situ real-time temperature acquisition in the severe environments has important significance for material selection, structural design, protective measures, and the like of the aerospace vehicles.

Compared with traditional wired active devices, wireless passive sensing devices based on high-temperature-resistant materials have significant advantages in testing in the severe environments such as high temperature, narrow and airtight environments, and a surface acoustic wave technology can implement wireless passive monitoring of long-distance sensor signals. Because of simple structure, small size, high anti-interference performance, good stability, and wireless passive testing, a surface acoustic wave sensor is a wireless monitoring technology with application prospects at present.

The existing surface acoustic wave temperature sensor uses a structure of a sensing module and an external antenna module. The sensing module includes an interdigital transducer and a reflection grating. The sensing module and the antenna module are separated, and most of the antenna modules use dipole antenna structures having a large volume, so that the surface acoustic wave temperature sensor has a large volume, and cannot be applied in the above environments having a narrow space.

SUMMARY

The present disclosure provides a surface acoustic wave temperature sensor and a manufacturing method thereof, for solving the above technical problems existing in the prior art, and capable of performing wireless passive temperature monitoring in a high-temperature and narrow space.

The surface acoustic wave temperature sensor provided by the present disclosure includes a sensing module and an antenna module electrically connected to each other. The antenna module includes a first high-temperature-resistant substrate and a patterned antenna formed on a surface of the first high-temperature-resistant substrate. A recess is formed in a first surface of the first high-temperature-resistant substrate, and the sensing module is fixed in the recess.

Furthermore, the first high-temperature-resistant substrate is a high temperature co-fired ceramic substrate.

Optionally, the patterned antenna includes a first bottom plate located on the first surface of the first high-temperature-resistant substrate, a second bottom plate located on a second surface of the first high-temperature-resistant substrate opposite to the first surface, and an inverted-F antenna. The first bottom plate and the second bottom plate are electrically connected by means of through holes in the first high-temperature-resistant substrate. The inverted-F antenna includes a first horizontal branch, a second horizontal branch, and a vertical branch. The first horizontal branch is connected to the second bottom plate and electrically connected to a ground terminal of the first surface by means of a through hole in the first high-temperature-resistant substrate. The second horizontal branch is electrically connected to a feed terminal of the first surface by means of a through hole in the first high-temperature-resistant substrate. The vertical branch is arranged around the second bottom plate.

Furthermore, a tail end of the vertical branch is connected to the second bottom plate by means of a matching inductor.

Optionally, the sensing module includes a second high-temperature-resistant substrate, and an interdigital transducer and a reflection grating formed on a surface of the second high-temperature-resistant substrate.

Furthermore, the second high-temperature-resistant substrate is a langasite substrate.

The manufacturing method for a surface acoustic wave temperature sensor provided by the present disclosure includes: manufacturing a sensing module; manufacturing an antenna module, where the antenna module includes a first high-temperature-resistant substrate, a patterned antenna formed on a surface of the first high-temperature-resistant substrate, and a recess formed in a first surface of the first high-temperature-resistant substrate; fixing the sensing module in the recess; and electrically connecting the sensing module and the antenna module.

Optionally, the method for manufacturing the sensing module includes: coating photoresist on a second high-temperature-resistant substrate; photoetching the photoresist by using a sensor mask; developing the photoresist to form patterned photoresist; forming a metal layer on a surface of the patterned photoresist; and removing the patterned photoresist to form an interdigital transducer and a reflection grating on a surface of the second high-temperature-resistant substrate.

Optionally, the method for manufacturing the first high-temperature-resistant substrate in the antenna module includes: cutting an alumina green tape to obtain M green tape membranes having a same size; manufacturing positioning holes for positioning and through holes for lead connection in the green tape membranes; filling metal in the through holes; manufacturing openings for forming the recess in N of the M green tape membranes; stacking, according to the positioning holes, the M green tape membranes in a manner that the N green tape membranes are stacked on the lower part and the rest green tape membranes are stacked on the upper part; filling a sacrificial layer material at the openings; laminating and cutting the stacked M green tape membranes to form an antenna substrate blank sample; and sintering the antenna substrate blank sample to volatilize the sacrificial layer material to form the first high-temperature-resistant substrate having the recess.

Optionally, the method for forming the patterned antenna on the surface of the first high-temperature-resistant substrate includes: depositing metal slurry on the surface of the first high-temperature-resistant substrate by using a screen printing template; and sintering the first high-temperature-resistant substrate at a high temperature to form the patterned antenna.

Optionally, the method for fixing the sensing module in the recess includes: coating an alumina high-temperature ceramic adhesive at a bottom of the recess; and placing the sensing module in the recess, so that a bottom of the sensing module, where a device is not formed, is bonded to the bottom of the recess.

Optionally, the method for electrically connecting the sensing module and the antenna module includes: respectively soldering a feed terminal and a ground terminal of the patterned antenna to electrode ports of the sensing module by using metal wires.

Furthermore, the manufacturing method further includes: sintering the sensing module and the antenna module at a high temperature.

In the surface acoustic wave temperature sensor and the manufacturing method thereof provided by the present disclosure, the patterned antenna of the antenna module is formed on the surface of the first high-temperature-resistant substrate, the recess is formed in the first surface of the substrate, the sensing module is fixed in the recess and electrically connected to the antenna module, and the sensing module and the antenna module form a whole. Therefore, compared with the prior art, the volume is greatly reduced, and wireless passive temperature monitoring in a high-temperature and narrow space can be better implemented. Moreover, the sensing module can be integrated in the antenna module, and such a structure is more convenient for batch processing.

In addition, the antenna module adopts the high-temperature-resistant substrates, which can significantly improve high-temperature resistance of the temperature sensor.

BRIEF DESCRIPTION OF THE DRAWINGS

To describe the technical solutions in embodiments of the present disclosure or in the prior art more clearly, the accompanying drawings required for describing the embodiments or the prior art are briefly described below. Apparently, the accompanying drawings in the following descriptions show some embodiments of the present disclosure, and a person of ordinary skill in the art may still derive other accompanying drawings from these accompanying drawings without creative efforts.

DETAILED DESCRIPTION OF THE EMBODIMENTS

To make the objectives, technical solutions, and advantages of the present disclosure clearer, the technical solutions in the embodiments of the present disclosure are clearly and completely described below with reference to the accompanying drawings in the embodiments of the present disclosure. Apparently, the described embodiments are some but not all of the embodiments of the present disclosure. All other embodiments obtained by a person of ordinary skill in the art based on the embodiments of the present disclosure without creative efforts shall fall within the protection scope of the present disclosure.

To make the technical solutions of the present disclosure clearer, the embodiments of the present disclosure are described in detail below with reference to the accompanying drawings.

Figure 1:
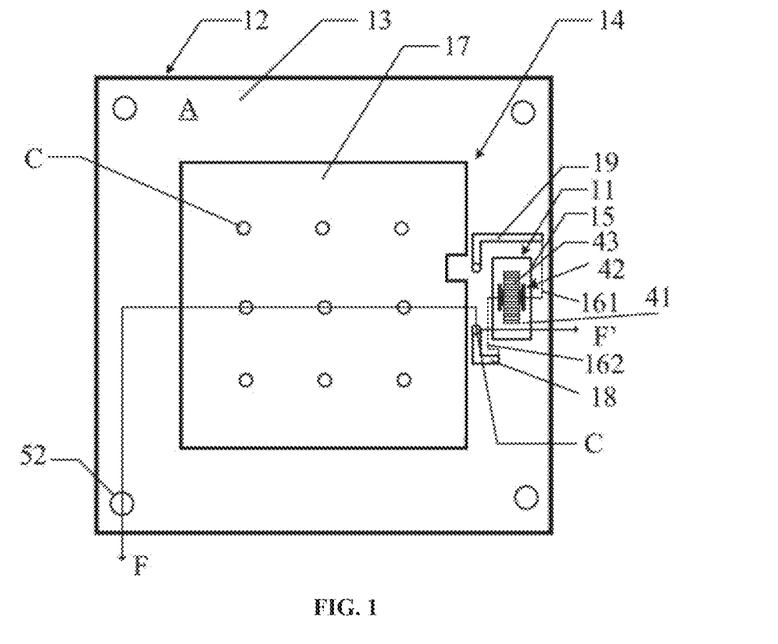
FIG. 1 is a schematic structural diagram of a first surface of a first high-temperature-resistant substrate in a surface acoustic wave temperature sensor provided by embodiments of the present disclosure.
Figure 2:
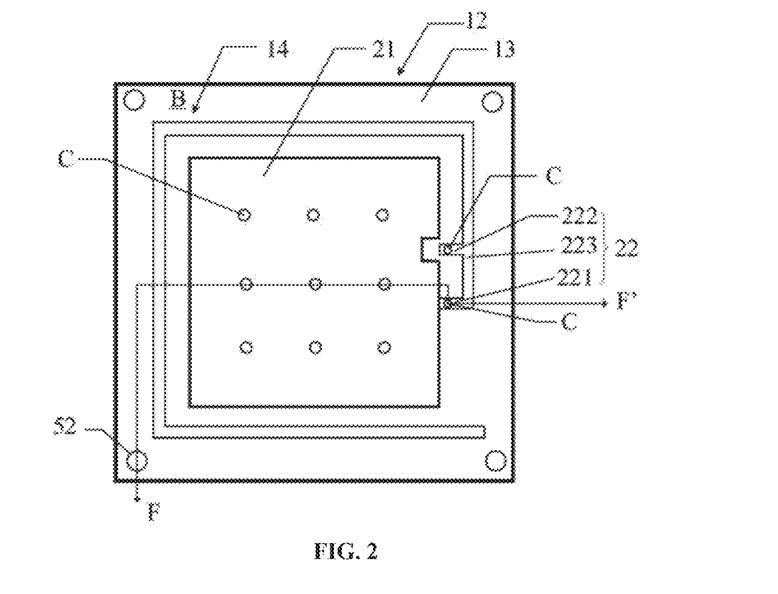
FIG. 2 is a schematic structural diagram of a second surface of a first high-temperature-resistant substrate in a surface acoustic wave temperature sensor shown in FIG. 1.

Embodiments of the present disclosure provide a surface acoustic wave temperature sensor. As shown in FIG. 1 and FIG. 2, the surface acoustic wave temperature sensor includes a sensing module 11 and an antenna module 12 electrically connected to each other. The antenna module 12 includes a first high-temperature-resistant substrate 13 and a patterned antenna 14 formed on a surface of the first high-temperature-resistant substrate 13. A recess 15 is formed in a first surface A of the first high-temperature-resistant substrate 13, and the sensing module 11 is fixed in the recess 15.

Specifically, FIG. 1 shows the first surface A of the first high-temperature-resistant substrate 13, FIG. 2 shows a second surface B of the first high-temperature-resistant substrate 13, and the patterned antenna (17, 21, 22) is formed on the two surfaces. The recess 15 is formed in one side of the patterned antenna 14 and close to the first surface A of the patterned antenna 14. The sensing module 11 is fixed in the recess 15. Metal wires (161, 162) between the recess 15 and the patterned antenna 14 are configured to electrically connect the sensing module 11 and the patterned antenna 14 in the antenna module 12.

In the surface acoustic wave temperature sensor provided by embodiments of the present disclosure, the patterned antenna of the antenna module is formed on the surface of the first high-temperature-resistant substrate, the recess is also formed in the first surface of the substrate, the sensing module is fixed in the recess and electrically connected to the antenna module, and the sensing module and the antenna module form a whole. Therefore, compared with the prior art, the volume is greatly reduced, and wireless passive temperature monitoring in a high-temperature and narrow space can be better implemented. Moreover, the sensing module can be integrated in the antenna module, and such a structure is more convenient for batch processing.

In addition, the antenna module adopts the high-temperature-resistant substrates, which can significantly improve high-temperature resistance of the temperature sensor.

In the foregoing embodiments, the first high-temperature-resistant substrate 13 may be a high temperature co-fired ceramic (HTCC) substrate; and HTCC is a novel high-thermal-conductivity substrate and packaging material, which has the characteristics of high thermal conductivity, low thermal expansion coefficient, high dielectric constant, etc. The antenna module made of this material has excellent high-temperature resistance.

In addition, according to a formula of resonance frequency of the antenna: $f_r \approx c/[2L(\xi_r)^{1/2}]$, where c is a velocity of light in vacuum, L is a length of a rectangular patch of the antenna, and $\xi_r$ is a relative dielectric constant of the substrate material. It can be seen from the formula that the resonance frequency is inversely proportional to the dielectric constant. Therefore, the resonance frequency can be reduced by using the HTCC substrate having a high dielectric constant. Moreover, the length of the rectangular patch is reduced when the resonance frequency remains unchanged.

In the prior art, the antenna mostly uses a printed circuit board as the substrate. Since the dielectric constant of the ceramic substrate is much higher than that of the printed circuit board, the embodiments of the present disclosure can effectively reduce the size of the antenna.

In the surface acoustic wave temperature sensor, as shown in FIG. 1 and FIG. 2, the patterned antenna includes a first bottom plate 17 located on the first surface A of the first high-temperature-resistant substrate 13, a second bottom plate 21 located on a second surface B of the first high-temperature-resistant substrate 13 opposite to the first surface A, and an inverted-F antenna 22. The first bottom plate 17 and the second bottom plate 21 are electrically connected by means of through holes C in the first high-temperature-resistant substrate.

The inverted-F antenna 22 is shaped like an inverted letter "F", and includes a first horizontal branch 221, a second horizontal branch 222, and a vertical branch 223. The first horizontal branch 221 is connected to the second bottom plate 21 and electrically connected to a ground terminal 18 of the first surface A by means of a through hole C in the first high-temperature-resistant substrate 13. The second horizontal branch 222 is electrically connected to a feed terminal 19 of the first surface A by means of a through hole C in the first high-temperature-resistant substrate 13. The vertical branch 223 is arranged around the second bottom plate 21.

It should be noted that: the feed terminal 19 and the ground terminal 18 are formed simultaneously with the first bottom plate on the first surface A, and are also a part of the patterned antenna 14.

The inverted-F antenna has a low-profile structure, and has horizontal polarization and vertical polarization in a radiation field. Moreover, due to compact structure, isotropic radiation characteristics, and good ground design, the inverted-F antenna can effectively improve the working efficiency and increase the transmission distance.

Figure 3:
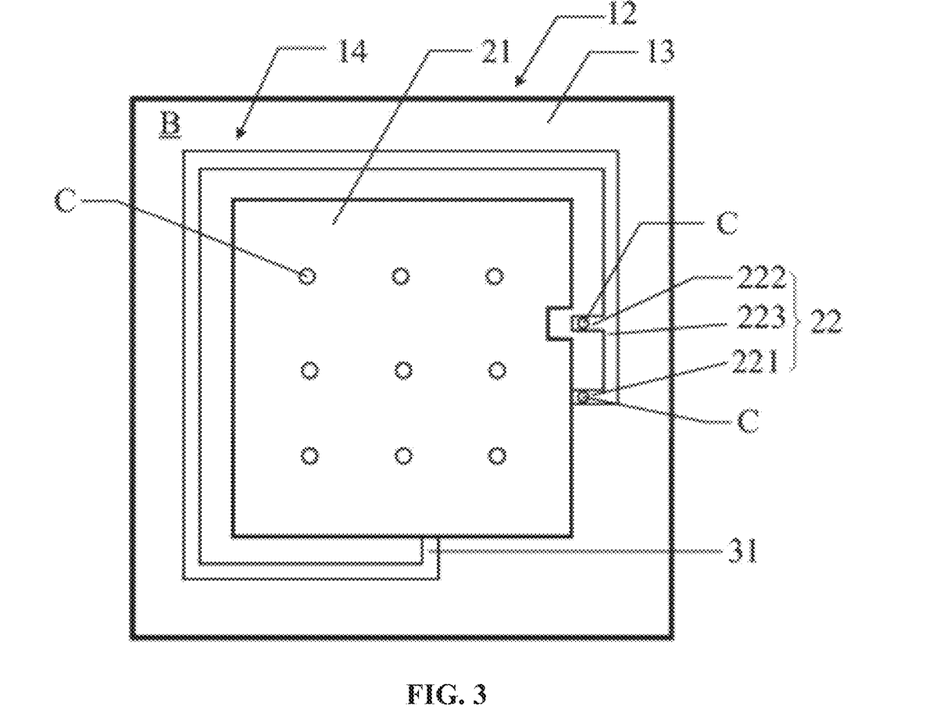
FIG. 3 is a schematic structural diagram of another patterned antenna provided by embodiments of the present disclosure.

As shown in FIG. 2 or FIG. 3, a tail end of the vertical branch 223 of the inverted-F antenna is connected to the second bottom plate B by means of a matching inductor 31. For the patterned antenna to obtain the highest emission frequency, the impedance of the patterned antenna needs to match the impedance of a signal source terminal. If the impedance matching is not done properly, a part of power will be reflected back to the signal source terminal, thereby reducing the transmission power of the patterned antenna. The impedance of a radio-frequency signal source terminal is mostly 50Ω. For the designed patterned antenna, the impedance is not 50Ω. In this case, the matching inductor 31 needs to be connected in series to achieve the impedance matching.

The patterned antenna in the surface acoustic wave temperature sensor provided by the embodiments of the present disclosure is not limited to the above structure, and any other patterned antenna that can achieve functions of transmitting and receiving electromagnetic wave signals can be used in the present disclosure.

Figure 4:
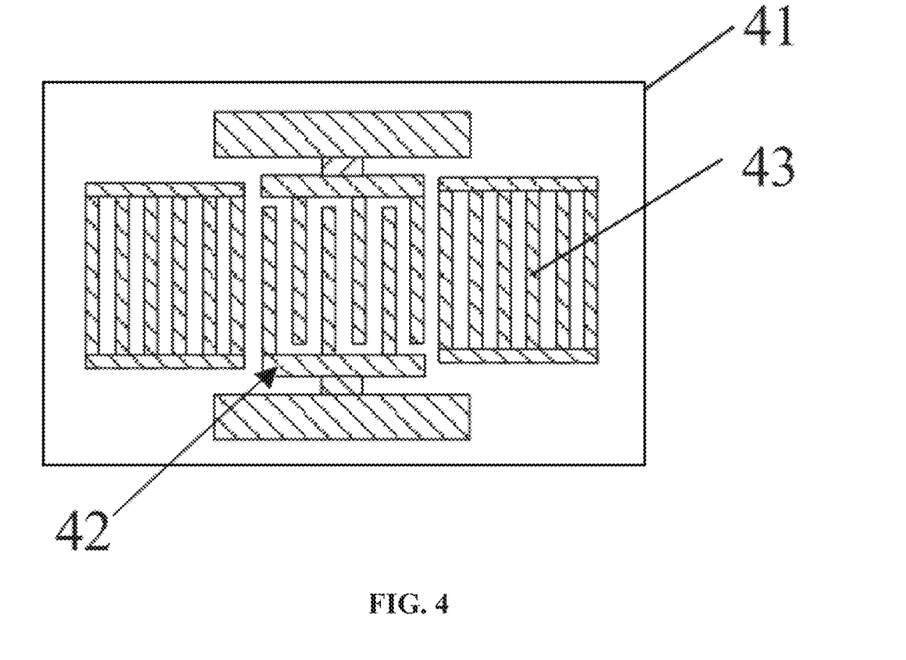
FIG. 4 is a schematic structural diagram of a sensing module provided by embodiments of the present disclosure.

As shown in FIG. 1 and FIG. 4, the sensing module 11 in the surface acoustic wave temperature sensor includes a second high-temperature-resistant substrate 41, and an interdigital transducer 42 and a reflection grating 43 formed on a surface of the second high-temperature-resistant substrate 41. When an external temperature changes, the material properties of the material of the second high-temperature-resistant substrate 41 change due to the change of thermal stress, resulting in a slight change in a distance between the interdigital transducer 42 and the reflection grating 43, and interdigital spacing of the interdigital transducer 42 changes slightly, thereby influencing a propagation velocity of surface acoustic waves. Sensing characteristics of the surface acoustic wave temperature sensor are represented by the resonance frequency, and an offset of the resonance frequency can represent the change of temperature, so that wireless passive temperature measurement can be implemented.

The second high-temperature-resistant substrate 41 is mostly a langasite substrate, and of course other materials known to a person skilled in the art may also be used.

The embodiments of the present disclosure also provide a manufacturing method for a surface acoustic wave temperature sensor. The method includes the following steps.

Step 1, manufacture a sensing module 11 as shown in FIG. 1 to FIG. 4.

Step 2, manufacture an antenna module 12 as shown in FIG. 1 to FIG. 4, where the antenna module 12 includes a first high-temperature-resistant substrate 13, a patterned antenna 14 formed on a surface of the first high-temperature-resistant substrate 13, and a recess 15 formed in a first surface A of the first high-temperature-resistant substrate 13.

Step 3, fix the sensing module 11 in the recess 15.

Step 4, electrically connect the sensing module 11 and the antenna module 12.

In the manufacturing method for a surface acoustic wave temperature sensor provided by the embodiments of the present disclosure, the patterned antenna of the antenna module is formed on the surface of the first high-temperature-resistant substrate, the recess is also formed in the first surface of the substrate, the sensing module is fixed in the recess and electrically connected to the antenna module, and the sensing module and the antenna module form a whole. Therefore, compared with the prior art, the volume is greatly reduced, and wireless passive temperature monitoring in a high-temperature and narrow space can be better implemented. Moreover, the sensing module can be integrated in the antenna module, and such a structure is more convenient for batch processing.

In addition, the antenna module adopts the high-temperature-resistant substrates, which can significantly improve high-temperature resistance of the temperature sensor.

In the above method, as shown in FIG. 6, the method for manufacturing the sensing module 11 may specifically include the following steps.

Figure 6A:
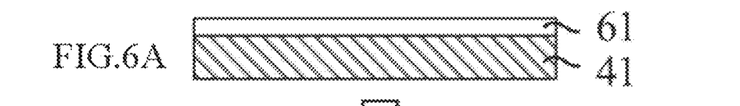
FIG. 6 is a flow diagram of a method for manufacturing a sensing module provided by embodiments of the present disclosure.

FIG. 6A, coat photoresist 61 on a second high-temperature-resistant substrate 41.

First, pretreatment can be performed. The surface of the second high-temperature-resistant substrate 41 (which may be a langasite substrate) is cleaned with acetone, anhydrous ethanol, and deionized water and dried with nitrogen. Then, a layer of positive photoresist 61 is coated on the cleaned surface of the second high-temperature-resistant substrate 41 by using a spin coater. Post-baking is performed to fully volatilize an organic solvent inside the photoresist 61 to improve the quality of photoetching.

Figure 6B:
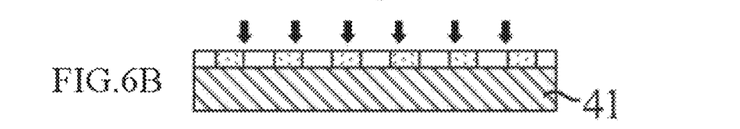

FIG. 6B, photoetch the photoresist 61 by using a sensor mask.

Figure 6C:
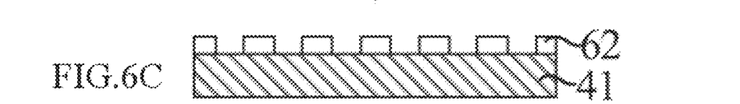

FIG. 6C, develop the photoresist to form patterned photoresist 62.

The sensor mask on which an interdigital electrode and a reflection grating are etched can be photoetched by using an ultraviolet photoetching machine, the photoetched second high-temperature-resistant substrate 41 is developed in a matching developer of the positive photoresist 61 to remove the redundant photoresist, and the patterned photoresist 62 having interdigital electrode and reflection grating patterns is left.

Figure 6D:
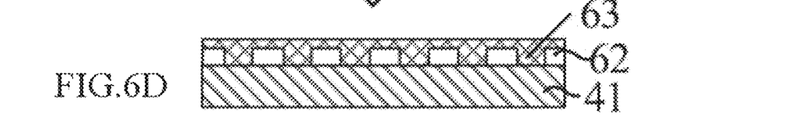

FIG. 6D, form a metal layer 63 on a surface of the patterned photoresist 62.

Platinum metal can be sputtered on a surface of the interdigital electrode and a surface of the reflection grating by using a method of magnetron sputtering, and other metal materials known to a person skilled in the art may also be used.

Figure 6E:
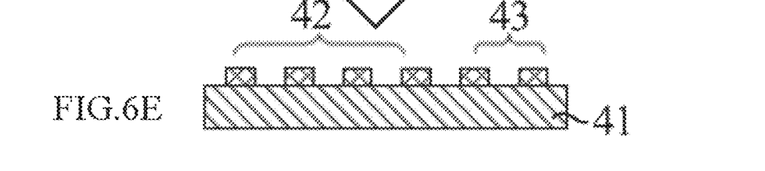

FIG. 6E, remove the patterned photoresist 62 to form an interdigital transducer 42 and a reflection grating 43 on a surface of the second high-temperature-resistant substrate 41.

The patterned photoresist 62 can be removed with acetone, the interdigital electrode forms the interdigital transducer 42, the remainder forms the reflection grating 43, and finally the surface acoustic wave temperature sensor as shown in FIG. 4 is formed. Only a partial interdigital transducer 42 and a partial reflection grating 43 are shown in FIG. 6.

Figure 6F:
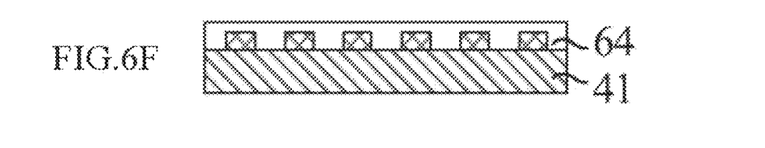

FIG. 6F, deposit a protective film 64 on the surface of the second high-temperature-resistant substrate 41.

Thereafter, an aluminum oxide film of 200 nm can be plated on the surface of the manufactured surface acoustic wave temperature sensor by using a pulsed laser deposition system, and parameters are set as follows: the temperature of the substrate is 200° C., and the laser intensity is 500 mJ and the frequency is 3 Hz in a vacuum environment.

Since the exposed interdigital electrode and reflection grating are subjected to phenomena such as agglomeration, cracking, and even fracture in a high-temperature environment, depositing an alumina film on the interdigital electrode and the reflection grating can prevent these phenomena.

In the manufacturing method for a surface acoustic wave temperature sensor, as shown in FIG. 5, the method for manufacturing the first high-temperature-resistant substrate 13 in the antenna module 12 includes the following steps.

Figure 5A:
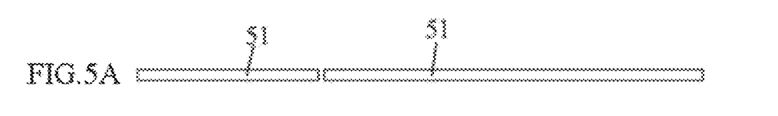
FIG. 5 is a flow diagram of a method for manufacturing an antenna module provided by embodiments of the present disclosure.

FIG. 5A, cut an alumina green tape to obtain M green tape membranes having a same size.

The alumina green tape can be cut into 8×8 inches of the green tape membranes 51, the protective film is removed, and surfaces of the green tape membranes 51 are cleaned by means of air shower or the like.

Figure 5B:
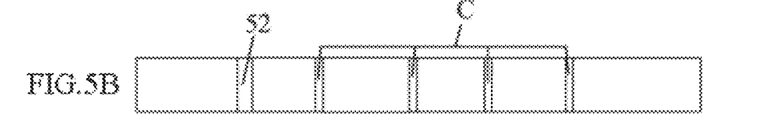

FIG. 5B, manufacture positioning holes 52 for positioning and through holes C for lead connection on the green tape membranes.

The positioning holes 52 and the through holes C for lead connection can be drilled at the four corners of each alumina green tape membrane 51 by using a laser drilling machine, and the green tape membranes are accurately placed on a laminated mold through the positioning holes 52.

Figure 5C:
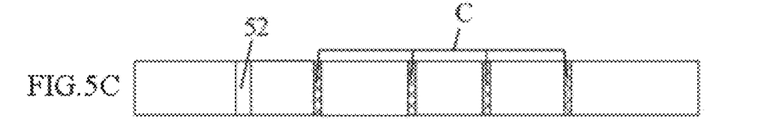
Figure 5D:
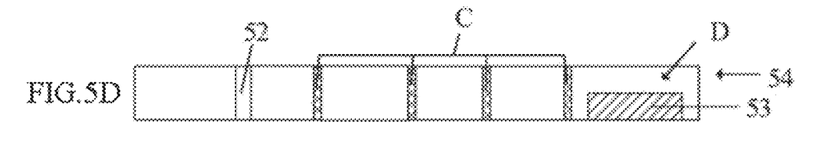
Figure 5E:
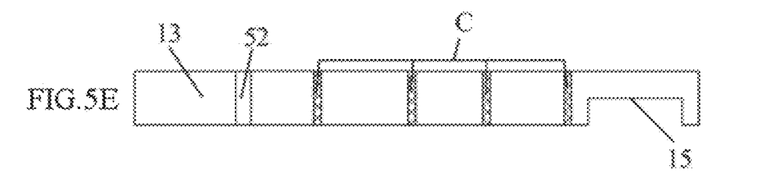
Figure 5F:
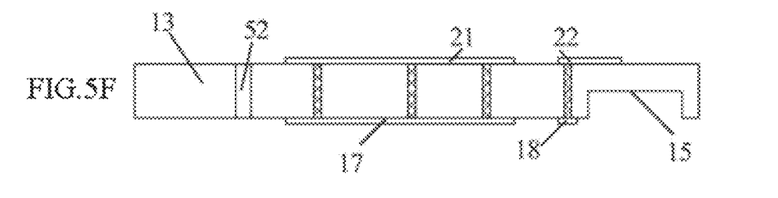

It should be noted that: the figures corresponding to step FIG. 5B to step FIG. 5F are schematic cross-sectional diagrams of the M green tape membranes stacked together, and are schematic cross-sectional diagrams of positions along a cutting line F-F in FIG. 1 and FIG. 2. Since the number of M is different in different application scenarios, each green tape membrane is not shown in the figures, but the M green tape membranes are shown as a whole.

FIG. 5C, fill metal in the through holes C.

FIG. 5D, manufacture openings D for forming the recess 15 in N of the M green tape membranes; stack, according to the positioning holes 52, the M green tape membranes in a manner that the N green tape membranes are stacked on the lower part and the rest green tape membranes are stacked on the upper part; fill a sacrificial layer material 53 at the openings D; and then laminate and cut the stacked M green tape membranes to form an antenna substrate blank sample 54.

The number of M may be 8, and the number of N may be 4. The openings D need to be formed in the four green tape membranes placed on a lower layer, and a size of the openings D may be 0.9 cm×0.7 cm×0.5 mm (the size is slightly larger than that of the sensing module 11). During lamination, the openings need to be filled with the sacrificial layer material 53 to prevent a cavity from collapsing during subsequent lamination. According to an adhesive removal time and thickness of the green tape membranes, a carbon film can be selected as the sacrificial layer material 53 to fill the cavity. The stacked green tape membranes 51 are sealed and laminated by using a vacuum packaging technology. The lamination temperature is set as 75° C., the pressure is set as 21 MPa, and both the pretreatment time and the lamination time are set as 10 minutes. After lamination, the green tape membranes are physically bonded to form a whole. After that, the laminated green tape is cut out as a whole to form the antenna blank sample 54.

FIG. 5E, sinter the antenna substrate blank sample 54 to volatilize the sacrificial layer material 53 to form the first high-temperature-resistant substrate 13 having the recess 15.

The antenna substrate blank sample 54 is placed on an alumina ceramic setter, and covered with a hollowed-out thin ceramic plate to prevent the antenna substrate blank sample 54 from being tilted when sintered. The antenna substrate blank sample 54 is placed in a muffle furnace, and a sintering curve is set. During sintering, organic matters are discharged to be volatilized with the carbon film 53, and the carbon film 53 is drained before ceramic forms a compact substrate structure. A slot is formed in the antenna substrate blank sample 54, and ceramic particles in the antenna substrate blank sample 54 are tightly bonded by an inorganic adhesive to form a compact ceramic substrate structure.

In the manufacturing method for a surface acoustic wave temperature sensor, as shown in the figure corresponding to step FIG. 5F in FIG. 5, the method for manufacturing the pattered antenna 14 on the surface of the first high-temperature-resistant substrate 13 specifically includes the following steps.

Step 1, deposit metal slurry on the surface of the first high-temperature-resistant substrate 13 by using a screen printing template.

Step 2: sinter the first high-temperature-resistant substrate 13 at a high temperature to form the patterned antenna 14.

Specifically, platinum paste can be deposited on the surface of the first high-temperature-resistant substrate 13 by using a customized screen printing template. Since the platinum paste contains a large amount of binders and impurities, the organic solvent is volatilized and discharged during high-temperature sintering, and the platinum paste forms a conductor, thereby forming the patterned antenna 14.

In the manufacturing method for a surface acoustic wave temperature sensor, the method for fixing the sensing module 11 in the recess 15 may include the following steps.

Step 1, coat an alumina high-temperature ceramic adhesive at a bottom of the recess 15.

Step 2, place the sensing module 11 in the recess 15, so that a bottom of the sensing module 11, where a device is not formed, is bonded to the bottom of the recess 15.

In the manufacturing method for a surface acoustic wave temperature sensor, as shown in FIG. 1, the method for electrically connecting the sensing module 11 and the antenna module 12 may include the following steps.

Respectively solder a feed terminal 19 and a ground terminal 18 of the patterned antenna 14 to electrode ports of the sensing module 11 by using metal wires (161, 162).

The electrode ports of the sensing module 11 are ports of two electrodes on the interdigital transducer, and the feed terminal 19 and the ground terminal 18 of the patterned antenna 14 are formed while the first bottom plate 17 is formed on the first surface A.

The manufacturing method for a surface acoustic wave temperature sensor may further include: sintering the sensing module 11 and the antenna module 12 at a high temperature.

Specifically, alumina high-temperature ceramic adhesive is configured to fix the sensing module 11. In addition, metal platinum paste is configured to electrically connect the sensing module and the antenna module. Therefore, by placing the device in the muffle furnace for sintering, the high-temperature ceramic adhesive and the platinum paste are sintered at a high temperature, so that the high-temperature adhesive is tightly bonded, and the platinum paste is conductive.

Figure 7:
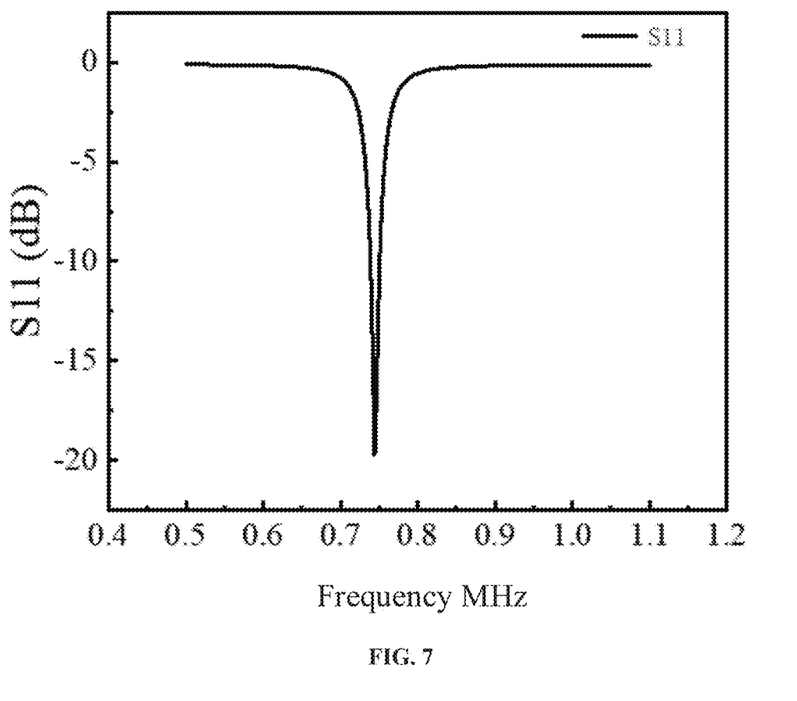
FIG. 7 is a simulation diagram of a patterned antenna in an antenna module provided by embodiments of the present disclosure.

As shown in FIG. 7, it is a simulation curve of the patterned antenna in the antenna module provided by the embodiments of the present disclosure. The simulation curve is generated after testing using HFSS (High Frequency Structure Simulator) software. By analyzing the simulation curve, it can be seen that the resonance frequency of the patterned antenna provided by the embodiments of the present disclosure is 750 MHz, and S11 parameter can meet the performance requirement. The return loss of the patterned antenna at a center frequency is −19.5 dB, indicating that the antenna has good performance.

Finally, it should be noted that the above embodiments are merely intended to describe the technical solutions of the present disclosure, rather than to limit the present disclosure. Although the present disclosure is described in detail with reference to the above embodiments, a person of ordinary skill in the art should understand that they may still make modifications to the technical solutions described in the above embodiments or make equivalent replacements to some technical features thereof, without departing from the essence of the technical solutions in the embodiments of the present disclosure.

What is claimed:

1. A manufacturing method for a surface acoustic wave temperature sensor, comprising:
    manufacturing a sensing module;
    manufacturing an antenna module, wherein the antenna module comprises a first high-temperature-resistant substrate, a patterned antenna formed on a surface of the first high-temperature-resistant substrate, and a recess formed in a first surface of the first high-temperature-resistant substrate;
    fixing the sensing module in the recess; and
    electrically connecting the sensing module and the antenna module;
    wherein the method for manufacturing the sensing module comprises:
    coating a photoresist on a second high-temperature-resistant substrate;
    photoetching the photoresist by using a sensor mask;
    developing the photoresist to form a patterned photoresist;
    forming a metal layer on a surface of the patterned photoresist; and
    removing the patterned photoresist to form an interdigital transducer and a reflection grating on a surface of the second high-temperature-resistant substrate.

2. The method according to claim 1, wherein the first high-temperature-resistant substrate in the antenna module is manufactured as follows:
    cutting an alumina green tape to obtain a plurality of green tape membranes having a same size;
    manufacturing positioning holes for positioning and through holes for a lead connection in the plurality of green tape membranes;
    filling metal in the through holes;
    manufacturing openings for forming the recess in at least one green tape membrane of the plurality of green tape membranes;
    stacking, according to the positioning holes, the plurality of green tape membranes in a manner that the at least one green tape membranes are stacked on a lower part and rest of green tape membranes are stacked on an upper part; filling a sacrificial layer material at the openings;
    laminating and cutting the plurality of green tape membranes stacked to form an antenna substrate blank sample; and
    sintering the antenna substrate blank sample to volatilize the sacrificial layer material to form the first high-temperature-resistant substrate having the recess.

3. The method according to claim 1, wherein the method for forming the patterned antenna is formed on the surface of the first high-temperature-resistant substrate as follows:
    depositing a metal slurry on the surface of the first high-temperature-resistant substrate by using a screen printing template; and
    sintering the first high-temperature-resistant substrate at a high temperature with the metal slurry on the surface to form the patterned antenna.

4. The method according to claim 1, wherein the method for fixing the sensing module in the recess comprises:
    coating an alumina high-temperature ceramic adhesive at a bottom of the recess; and
    placing the sensing module in the recess, so that a bottom of the sensing module, where a device is not formed, is bonded to the bottom of the recess.

5. The method according to claim 1, wherein the method for electrically connecting the sensing module and the antenna module comprises:
    respectively soldering a feed terminal and a ground terminal of the patterned antenna to electrode ports of the sensing module by using metal wires.

6. The method according to claim 1, further comprising:
    after electrically connecting the sensing module and the antenna module, sintering the sensing module and the antenna module at a high temperature.

* * * * *